United States Patent
Wei et al.

(10) Patent No.: US 11,916,557 B2
(45) Date of Patent: Feb. 27, 2024

(54) CLOCK SPREAD SPECTRUM CIRCUIT, ELECTRONIC EQUIPMENT, AND CLOCK SPREAD SPECTRUM METHOD

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xiangye Wei, Beijing (CN); Liming Xiu, Beijing (CN); Yuhai Ma, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/836,419

(22) Filed: Jun. 9, 2022

(65) Prior Publication Data

US 2022/0302911 A1    Sep. 22, 2022

Related U.S. Application Data

(63) Continuation of application No. 16/980,930, filed as application No. PCT/CN2019/083901 on Apr. 23, 2019, now Pat. No. 11,381,229.

(51) Int. Cl.
*H03K 5/1252* (2006.01)
*G06F 1/04* (2006.01)
*H03K 5/00* (2006.01)

(52) U.S. Cl.
CPC ............. *H03K 5/1252* (2013.01); *G06F 1/04* (2013.01); *H03K 5/00006* (2013.01)

(58) Field of Classification Search
CPC .... H03K 5/1252; H03K 5/00006; H03K 4/06; H03K 4/08; G06F 1/04
See application file for complete search history.

(56) References Cited

U.S. PATENT DOCUMENTS

| | | |
|---|---|---|
| 8,120,389 B2 | 2/2012 | Xiu |
| 11,196,454 B2 | 12/2021 | Wei |

(Continued)

FOREIGN PATENT DOCUMENTS

| | | |
|---|---|---|
| CN | 101404569 A | 4/2009 |
| CN | 101515913 A | 8/2009 |

(Continued)

OTHER PUBLICATIONS

International Search Report and Written Opinion from PCT/CN2019/083901 dated Jan. 23, 2020.

(Continued)

*Primary Examiner* — John W Poos
(74) *Attorney, Agent, or Firm* — Dilworth & Barrese, LLP.; Michael J. Musella, Esq.

(57) ABSTRACT

A clock spread spectrum circuit, an electronic equipment, and a clock spread spectrum method are disclosed. The clock spread spectrum circuit (10) includes a control circuit (11) and a signal generation circuit (12). The control circuit (11) is configured to generate a frequency control word according to a modulation parameter, and the frequency control word changes discretely with time; and the signal generation circuit (12) is configured to receive the frequency control word and generate and output a spread spectrum output signal that is spectrum-spread according to the frequency control word, and the spread spectrum output signal corresponds to the frequency control word.

10 Claims, 7 Drawing Sheets

(56) References Cited

U.S. PATENT DOCUMENTS

| | | | |
|---|---|---|---|
| 11,381,229 B2 | 7/2022 | Wei et al. | |
| 2009/0160493 A1 | 6/2009 | Zhihong | |
| 2018/0196460 A1* | 7/2018 | Xiu | ............................ H03L 7/08 |
| 2019/0052276 A1* | 2/2019 | Xiu | ......................... H03L 7/085 |
| 2021/0075426 A1 | 3/2021 | Wei | |

FOREIGN PATENT DOCUMENTS

| | | |
|---|---|---|
| CN | 102104394 A | 6/2011 |
| CN | 106708166 A | 5/2017 |
| CN | 108964660 A | 12/2018 |
| WO | 2004092935 A | 10/2004 |

OTHER PUBLICATIONS

Non-final Office Action from U.S. Appl. No. 16/980,930 dated Jul. 26, 2021.
Final Office Action from U.S. Appl. No. 16/980,930 dated Dec. 14, 2021.
U.S. Office Action from U.S. Appl. No. 17/837,214 dated Sep. 7, 2023.

* cited by examiner

CLOCK SPREAD SPECTRUM CIRCUIT, ELECTRONIC EQUIPMENT, AND CLOCK SPREAD SPECTRUM METHOD

This application is a continuation application of U.S. patent application Ser. No. 16/980,930 filed on Sep. 15, 2020 which is a U.S. National Phase Entry of International Patent Application No. PCT/CN2019/083901 filed on Apr. 23, 2019, and the entire contents of all of which are incorporated herein by reference.

TECHNICAL FIELD

Embodiments of the present disclosure relate to a clock spread spectrum circuit, an electronic equipment, and a clock spread spectrum method.

BACKGROUND

Electromagnetic interference (EMI) refers to the influence of the circuit system on the surrounding circuit system through conduction or radiation. Electromagnetic interference may degrade the circuit performance, and may even cause the failure of the entire circuit system. The clock signal is usually the signal with the highest frequency and steepest edge in the circuit system, and most electromagnetic interference problems are related to high frequency clock signals. Methods for reducing electromagnetic interference include shielding, filtering, isolation, signal edge control, layout of the printed circuit board (PCB) such as providing a power layer and a ground (GND) layer in the PCB, etc. However, these methods have high cost and low efficiency, and also have a certain negative impact on the performance of the circuit system.

Clock spread spectrum is another effective method for reducing the EMI. The clock spread spectrum disperses the energy concentrated in a narrow frequency band to a predetermined wide frequency band by means of frequency modulation, so that the amplitude (energy) of the clock at the fundamental frequency and the odd harmonic wave frequency may be reduced to achieve the purpose of reducing the peak value of electromagnetic radiation of the system.

SUMMARY

At least one embodiment of the present disclosure provides a clock spread spectrum circuit, comprising: a control circuit, configured to generate a frequency control word according to a modulation parameter, the frequency control word changing discretely with time; and a signal generation circuit, configured to receive the frequency control word and generate and output a spread spectrum output signal that is spectrum-spread according to the frequency control word, the spread spectrum output signal corresponding to the frequency control word.

For example, in the clock spread spectrum circuit provided by at least one embodiment of the present disclosure, the frequency control word is expressed as: $F(t)=I+r(t)$, where $F(t)$ is the frequency control word, $I$ is an integer part of the frequency control word, $I$ is a constant and an integer, $r(t)$ is a decimal part of the frequency control word, $r(t)$ is a decimal and discretely changes with the time, and t represents the time.

For example, in the clock spread spectrum circuit provided by at least one embodiment of the present disclosure, the modulation parameter comprises a spread spectrum depth coefficient, a spread spectrum reference value, a modulation rate, a reference frequency, and a modulation mode, which correspond to the spread spectrum output signal, and the control circuit comprises: a decimal generation sub-circuit, configured to generate the decimal part according to the spread spectrum depth coefficient, the spread spectrum reference value, the modulation mode, and the modulation rate; an integer generation sub-circuit, configured to generate the integer part according to the reference frequency; and a synthesis sub-circuit, configured to receive the decimal part and the integer part and generate the frequency control word based on the decimal part and the integer part.

For example, in the clock spread spectrum circuit provided by at least one embodiment of the present disclosure, the decimal generation sub-circuit comprises: a frequency modulation control module, configured to generate a frequency modulation clock signal according to the modulation rate to control a rate of change of the frequency control word; and a decimal generation module, configured to generate and output the decimal part to the synthesis sub-circuit according to the modulation mode, the spread spectrum depth coefficient, and the spread spectrum reference value under control of the frequency modulation clock signal.

For example, in the clock spread spectrum circuit provided by at least one embodiment of the present disclosure, the decimal generation module comprises a modulation mode sub-module, the modulation mode comprises a triangle modulation mode, a sawtooth modulation mode, a sinusoidal modulation mode, or a random modulation mode, and the modulation mode sub-module is configured to generate the decimal part by using any one modulation mode selected from a group consisting of the triangle modulation mode, the sawtooth modulation mode, the sinusoidal modulation mode, and the random modulation mode.

For example, in the clock spread spectrum circuit provided by at least one embodiment of the present disclosure, the frequency modulation control module comprises: a counting sub-module, configured to count a reference clock signal to obtain a count value of the reference clock signal; and a timing sub-module, configured to determine a count period according to the modulation rate and determine the frequency modulation clock signal based on the count period and the count value.

For example, in the clock spread spectrum circuit provided by at least one embodiment of the present disclosure, the signal generation circuit comprises: a base time unit generation sub-circuit, configured to generate and output a base time unit; and a spread spectrum sub-circuit, configured to generate and output the spread spectrum output signal according to the frequency control word and the base time unit.

For example, in the clock spread spectrum circuit provided by at least one embodiment of the present disclosure, the base time unit generation sub-circuit comprises: a voltage-controlled oscillator, configured to oscillate at a predetermined oscillation frequency; a phase-locked loop circuit, configured to lock an output frequency of the voltage-controlled oscillator to a base output frequency; and K output terminals, configured to output K base output signals with phases evenly spaced, K is a positive integer greater than 1, and the base output frequency is expressed as $f_d$, the base time unit is a time span between any two adjacent base output signals output by the K output terminals, the base time unit is expressed as $\Delta$, and $\Delta=1/(K \cdot f_d)$.

For example, in the clock spread spectrum circuit provided by at least one embodiment of the present disclosure, the spread spectrum sub-circuit is a time average frequency direct period synthesizer.

For example, in the clock spread spectrum circuit provided by at least one embodiment of the present disclosure, a maximum value of the frequency control word and a minimum value of the frequency control word satisfy a formula: 0≤Fmin<1, and Fmin represents the minimum value of the frequency control word, and Fmax represents the maximum value of the frequency control word.

At least one embodiment of the present disclosure also provides an electronic equipment, comprising: the clock spread spectrum circuit according to any one of the above embodiments.

At least one embodiment of the present disclosure also provides a clock spread spectrum method, applied to the clock spread spectrum circuit according to any one of the above embodiments, and the clock spread spectrum method comprises: generating the frequency control word according to the modulation parameter, the frequency control word changing discretely with the time; and receiving the frequency control word, and generating and outputting the spread spectrum output signal that is spectrum-spread according to the frequency control word, the spread spectrum output signal corresponding to the frequency control word.

For example, in the clock spread spectrum method provided by at least one embodiment of the present disclosure, the frequency control word comprises a decimal part and an integer part, the modulation parameter comprises a spread spectrum depth coefficient, a spread spectrum reference value, a modulation mode, a modulation rate, and a reference frequency, which correspond to the spread spectrum output signal, and generating the frequency control word according to the modulation parameter comprises: generating the decimal part according to the spread spectrum depth coefficient, the spread spectrum reference value, the modulation mode, and the modulation rate, the decimal part being a decimal and changing discretely with the time; generating the integer part according to the reference frequency, the integer part being an integer; and generating the frequency control word according to the decimal part and the integer part.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
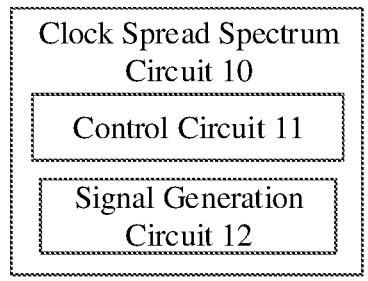
FIG. 1 is a schematic block diagram of a clock spread spectrum circuit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following descriptions of the embodiments of the present disclosure clear and concise, the present disclosure omits detailed descriptions of some known functions and known components.

With development of technology, the frequency of the clock signal is getting higher and higher, and the high frequency clock signal has strong electromagnetic interference. Currently, in order to effectively reduce the electromagnetic interference, periodic jitter may be introduced into the clock signal to implement the clock spread spectrum function to reduce the electromagnetic interference, that is, to allow respective periods of the clock signal to be different, in this way, the frequency spectrum of the clock signal may be a broadband spectrum, rather than a particularly pure peak. However, this method makes respective periods of the clock signal different, and if such a clock signal is used to drive a digital circuit, the setup time and the hold time of the digital circuit cannot be determined, so it is difficult to determine the parameter of clock spread spectrum.

At least some embodiments of the present disclosure provide a clock spread spectrum circuit, an electronic equipment, and a clock spread spectrum method, and the clock spread spectrum circuit includes a control circuit and a signal generation circuit. The control circuit is configured to generate a frequency control word according to a modulation parameter, and the frequency control word changes discretely with time; and the signal generation circuit is configured to receive the frequency control word and generate and output a spread spectrum output signal that is spectrum-spread according to the frequency control word, and the spread spectrum output signal corresponds to the frequency control word.

The clock spread spectrum circuit is based on time-average-frequency direct-period-synthesis (TAF-DPS) technology, uses TAF-DPS to generate the clock spread spectrum signal, can achieve to turn on spread spectrum functions of various modulation modes (such as a triangle wave modulation mode, and a sawtooth wave modulation mode) through the same circuit, and can not introduce additional noise when the spread spectrum function is turned on, that is, can effectively reduce the electromagnetic interference without affecting the normal operation of the circuit system. In addition, the clock spread spectrum circuit is an all-digital circuit, and has the advantages such as low power consumption, small size, programmable, and easy to be integrated in various chips.

Hereinafter, the embodiments of the present disclosure are described in detail with reference to the accompanying drawings, but the present disclosure is not limited to these specific embodiments.

FIG. 1 is a schematic block diagram of a clock spread spectrum circuit provided by some embodiments of the present disclosure.

For example, as illustrated in FIG. 1, the clock spread spectrum circuit 10 may include a control circuit 11 and a signal generation circuit 12. The control circuit 11 is configured to generate a frequency control word according to a modulation parameter, and the signal generation circuit 12 is configured to receive the frequency control word and generate and output a spread spectrum output signal that is spectrum-spread according to the frequency control word.

For example, the frequency control word changes discretely with time, and the spread spectrum output signal corresponds to the frequency control word.

It should be noted that, in the embodiments of the present disclosure, "the spread spectrum output signal corresponds to the frequency control word" means that the frequency of the spread spectrum output signal corresponds to the frequency control word, and the frequency of the spread spectrum output signal may be adjusted by the frequency control word. Because the frequency control word changes discretely with time, the frequency of the spread spectrum output signal also changes discretely with time, and the frequency spectrum of the spread spectrum output signal is a broadband spectrum, thereby achieving clock spread spectrum.

In the circuit system including the clock spread spectrum circuit provided by the embodiments of the present disclosure, the normal operation of the circuit system is not affected when the spread spectrum function is turned on and turned off, thereby ensuring the performance of the circuit system while achieving the purpose of reducing electromagnetic radiation.

For example, the frequency control word may be expressed as:

$$F(t)=I+r(t),$$

where F(t) is the frequency control word, I is an integer part of the frequency control word, r(t) is a decimal part of the frequency control word, r(t) changes discretely with time, and t represents the time. For example, the range of r(t) is [0, 1), that is, r(t) varies from 0 to 1, and r(t) can be 0, but cannot be 1. Therefore, in some examples, in a case where the integer part I of the frequency control word is unchanged, the maximum value of the frequency control word and the minimum value of the frequency control word may satisfy the following formula: $0 \leq Fmax-Fmin<1$, where Fmin represents the minimum value of the frequency control word, and Fmax represents the maximum value of the frequency control word.

It should be noted that although r(t) cannot be 1, the integer part I of the frequency control word can change. In this case, the maximum value Fmax of the frequency control word and the minimum value Fmin of the frequency control word can satisfy the following formula: $0 \leq Fmax-Fmin \leq 1$. For example, in other examples, Fmin=I+r(t), Fmax=(I+1)+r(t), r(t) can be set to 0, and therefore, Fmax-Fmin=1. In this case, the frequency control word F(t) still oscillates between two integers.

For example, the modulation parameter may include a reference frequency, a spread spectrum depth coefficient, a spread spectrum reference value, a modulation rate, a modulation mode, or the like, which correspond to the spread spectrum output signal.

For example, the reference frequency is the operating frequency of the circuit system, so that the reference frequency is determined based on the operating requirements of the circuit system. The present disclosure does not limit the specific value of the reference frequency.

For example, the spread spectrum depth coefficient may be determined according to the spread spectrum depth of the frequency of the spread spectrum output signal. For example, in some embodiments, if the reference frequency of the spread spectrum output signal is 100 MHz, the spread spectrum depth of the spread spectrum output signal is 20 MHz, that is, the frequency range of the spread spectrum output signal is from 90 MHz to 110 MHz, so that the spread spectrum depth coefficient may be ±0.1 (i.e., ±(the spread spectrum depth/2)/reference frequency).

For example, in some embodiments, the spread spectrum reference value may be set by the user according to actual needs, and for example, the spread spectrum reference value may be 0.5. In other embodiments, the spread spectrum reference value may also be determined by the operating frequency (i.e., the reference frequency) of the circuit system, that is, the reference frequency corresponds to a reference frequency control word, and a decimal part of the reference frequency control word is the spread spectrum reference value.

For example, the modulation rate represents the speed at which the frequency control word changes over time.

For example, the modulation mode may include a triangle modulation mode, a sawtooth modulation mode, a sinusoidal modulation mode, a random modulation mode, other custom modes, and the like. The user can select the corresponding modulation mode according to the actual application requirements. For example, different clock spread spectrum circuits may correspond to different modulation modes. But the present disclosure is not limited in this aspect, and different clock spread spectrum circuits may also correspond to the same modulation mode. For example, the same clock spread spectrum circuit may also correspond to different modulation modes, and different modulation modes may respectively correspond to different application scenarios of the clock spread spectrum circuit. The present disclosure does not specifically limit the type, the selection method, or the like of the modulation mode.

For example, the integer part I of the frequency control word is determined by the reference frequency. The decimal part r(t) of the frequency control word is determined by the spread spectrum depth coefficient, the spread spectrum reference value, the modulation rate, and the modulation mode.

For example, in some embodiments, the spread spectrum depth coefficient, the modulation mode, and the modulation rate may all be set by the user according to actual needs.

Figure 2:
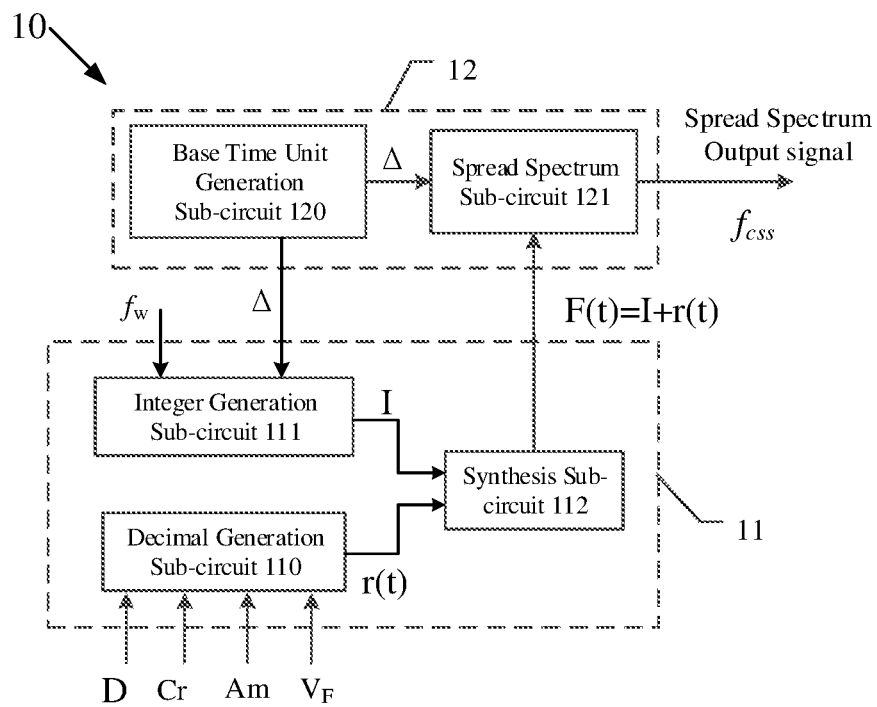
FIG. 2 is a schematic structural diagram of a clock spread spectrum circuit provided by some embodiments of the present disclosure.

FIG. 2 is a schematic structural diagram of a clock spread spectrum circuit provided by some embodiments of the present disclosure.

For example, the control circuit 11 may be implemented by hardware, and alternatively, the control circuit 11 may also be implemented by a combination of hardware and software. In some embodiments, the control circuit 11 may be implemented by hardware or the combination of hardware and software.

For example, in some embodiments, as illustrated in FIG. 2, the control circuit 11 may include a decimal generation sub-circuit 110, an integer generation sub-circuit 111, and a synthesis sub-circuit 112. For example, the decimal generation sub-circuit 110 is configured to generate the decimal part r(t) of the frequency control word F(t) according to the spread spectrum depth coefficient D, the spread spectrum reference value Cr, the modulation mode Am, and the modulation rate VF; the integer generation sub-circuit 111 is configured to generate the integer part I of the frequency control word F(t) according to the reference frequency $f_w$; and the synthesis sub-circuit 112 is configured to receive the decimal part r(t) of the frequency control word F(t) and the integer part I of the frequency control word F(t) and generate the frequency control word F(t) according to the decimal part r(t) of the frequency control word F(t) and the integer part I of the frequency control word F(t).

For example, in some embodiments, the decimal generation sub-circuit 110 is further configured to store the value of the decimal part r(t) of the frequency control word F(t). The integer generation sub-circuit 111 is further configured to store the value of the integer part I of the frequency control word F(t).

Figure 3A:
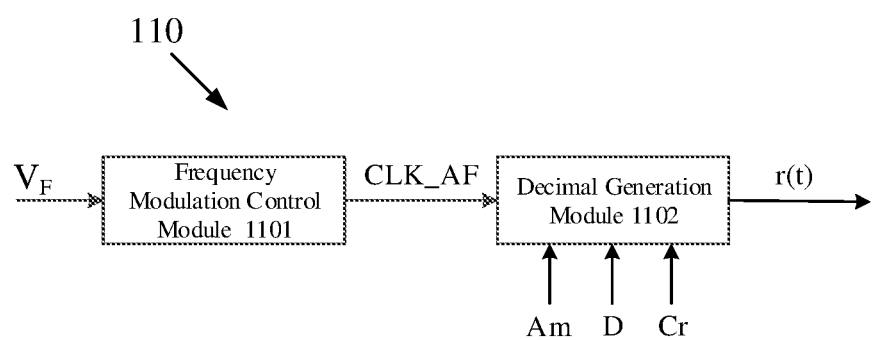
FIG. 3A is a schematic diagram of a decimal generation sub-circuit provided by some embodiments of the present disclosure.
Figure 3B:
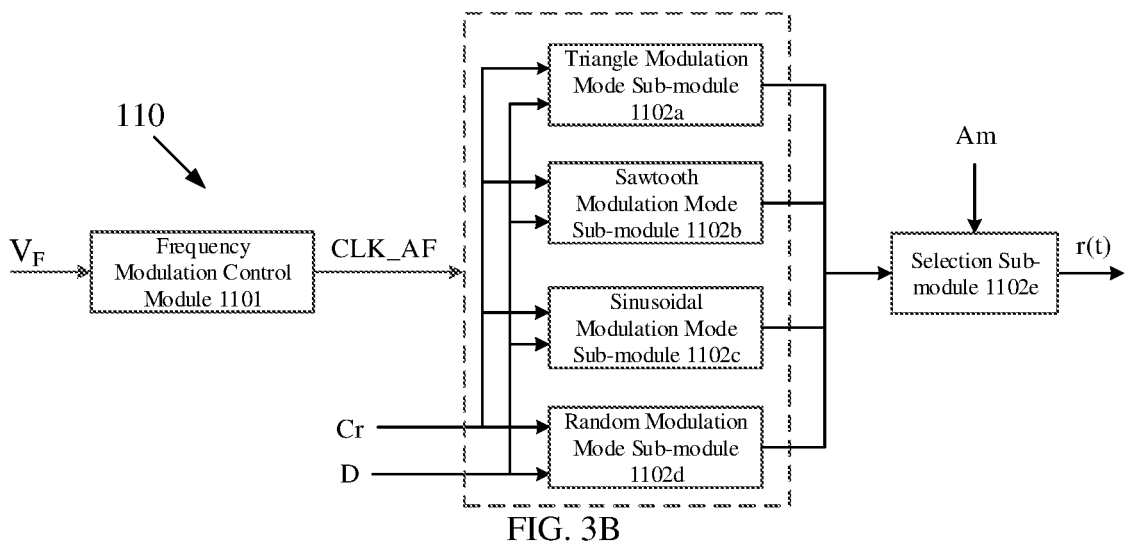
FIG. 3B is a schematic diagram of another decimal generation sub-circuit provided by some embodiments of the present disclosure.

FIG. 3A is a schematic diagram of a decimal generation sub-circuit provided by some embodiments of the present disclosure, and FIG. 3B is a schematic diagram of another decimal generation sub-circuit provided by some embodiments of the present disclosure.

For example, as illustrated in FIG. 3A, in other embodiments, the decimal generation sub-circuit 110 may include a frequency modulation control module (or a frequency modulation control sub-circuit) 1101 and a decimal generation module (or a generation sub-circuit) 1102. The frequency modulation control module 1101 is configured to generate a frequency modulation clock signal CLK_AF according to the modulation rate VF to control the rate of change of the decimal part r(t) of the frequency control word F(t) and finally control the rate of change of the frequency control word F(t). The decimal generation module 1102 is configured to generate and output the decimal part r(t) to the synthesis sub-circuit 112 according to the modulation mode Am, the spread spectrum depth coefficient D, and the spread spectrum reference value Cr under control of the frequency modulation clock signal CLK_AF.

For example, the spread spectrum mode of the spread spectrum output signal is central spread spectrum, and the range of the decimal part r(t) is: Cr−D/2≤r(t)≤Cr+D/2, so that the range of the frequency control word F(t) is: I+Cr−D/2≤F(t)≤I+Cr+D/2. In this case, the maximum value Fmax of the frequency control word is I+Cr+(D/2), and the minimum value Fmin of the frequency control word is I+Cr−(D/2). For another example, the spread spectrum mode of the spread spectrum output signal is up spread spectrum, and the range of the decimal part is: Cr−D≤r(t)≤Cr, so that the range of the frequency control word F(t) is: I+Cr−D≤F(t)≤I+Cr. In this case, the maximum value Fmax of the frequency control word is I+Cr, and the minimum value Fmin of the frequency control word is I+Cr−D. For another example, the spread spectrum mode of the spread spectrum output signal is down spread spectrum, and the range of the decimal part is: Cr≤r(t)≤Cr+D, so that the range of the frequency control word F(t) is: I+Cr≤F(t)≤I+Cr+D. In this case, the maximum value Fmax of the frequency control word is I+Cr+D, and the minimum value Fmin of the frequency control word is I+Cr.

For example, in some embodiments, the decimal generation module 1102 may include a modulation mode sub-module, and the modulation mode sub-module is used to control the spread spectrum mode of the decimal part r(t). For example, the modulation mode sub-module is configured to generate the decimal part r(t) by using any one of the modulation modes such as a triangle modulation mode, a sawtooth modulation mode, a sinusoidal modulation mode, and a random modulation mode.

For example, in other embodiments, the decimal generation module 1102 may include a selection sub-module and a plurality of modulation mode sub-modules corresponding to a plurality of modulation modes. As illustrated in FIG. 3B, the decimal generation module 1102 may include a triangle modulation mode sub-module 1102a, a sawtooth modulation mode sub-module 1102b, a sinusoidal modulation mode sub-module 1102c, a random modulation mode sub-module 1102d, and a selection sub-module 1102e. The triangle modulation mode sub-module 1102a is configured to generate a first middle decimal part corresponding to the triangle modulation mode according to the triangle modulation mode, the spread spectrum depth coefficient D, and the spread spectrum reference value Cr. The sawtooth modulation mode sub-module 1102b is configured to generate a second middle decimal part corresponding to the sawtooth modulation mode according to the sawtooth modulation mode, the spread spectrum depth coefficient D, and the spread spectrum reference value Cr. The sinusoidal modulation mode sub-module 1102c is configured to generate a third middle decimal part corresponding to the sinusoidal modulation mode according to the sinusoidal modulation mode, the spread spectrum depth coefficient D, and the spread spectrum reference value Cr. The random modulation mode sub-module 1102d is configured to generate a fourth middle decimal part corresponding to the random modulation mode according to the random modulation mode, the spread spectrum depth coefficient D, and the spread spectrum reference value Cr. The selection sub-module 1102e is configured to select one from a group consisting of the first middle decimal part, the second middle decimal part, the third middle decimal part, and the fourth middle decimal part as the decimal part r(t) of the frequency control word F(t) according to the modulation mode Am. For example, in one example, in a case where the modulation mode Am set by the user is the triangle modulation mode, the selection sub-module 1102e selects the first middle decimal part as the decimal part r(t) of the frequency control word F(t).

For example, the selection sub-module 1102e may include a multiplexer, and the multiplexer may be, for example, a 4-to-1 multiplexer.

In the example illustrated in FIG. 3B, the selection sub-module 1102e selects a corresponding middle decimal part corresponding to the modulation mode Am from the plurality of middle decimal parts according to the modulation mode Am and outputs the corresponding middle decimal part. However, the present disclosure is not limited in this aspect. For example, in other embodiments, the selection sub-module 1102e may select the mode control signal corresponding to the modulation mode Am from the mode control signal group according to the modulation mode Am, and the mode control signal group includes the triangle mode control signal, the sawtooth mode control signal, the sinusoidal mode control signal, and the random mode control signal. The mode control signal can be output to the triangle modulation mode sub-module 1102a, the sawtooth modulation mode sub-module 1102b, the sinusoidal modulation mode sub-module 1102c, and the random modulation mode sub-module 1102d, and the modulation mode sub-module corresponding to the modulation mode Am can generate and output the middle decimal part corresponding to the modulation mode Am under control of the mode control signal. For example, in some examples, if the modulation mode Am is the sawtooth modulation mode, the selection sub-module 1102e may select the sawtooth mode control signal from the mode control signal group, and then the sawtooth mode control signal is output to the triangle modulation mode sub-module 1102a, the sawtooth modulation mode sub-module 1102b, the sinusoidal modulation mode sub-module 1102c, and the random modulation mode sub-module 1102d. However, only the sawtooth modulation mode sub-module 1102b can generate and output the second middle decimal part corresponding to the sawtooth modulation mode under control of the sawtooth mode control signal, and none of the triangle modulation mode sub-module 1102a, the sinusoidal modulation mode sub-module 1102c, and the random modulation mode sub-module 1102d can generate the signal under control of the sawtooth mode control signal.

For example, in still other embodiments, the decimal generation module 1102 may include a plurality of modulation mode sub-modules corresponding to a plurality of modulation modes in one-to-one correspondence manner. In this case, only the modulation mode sub-module corresponding to the modulation mode Am set by the user can generate the middle decimal part, and the middle decimal part is output to the synthesis sub-circuit 112 as the decimal part r(t) of the frequency control word F(t), that is, the modulation mode Am can control the modulation mode sub-module corresponding to the modulation mode Am among the plurality of modulation mode sub-modules to generate the middle decimal part corresponding to the corresponding modulation mode according to the corresponding modulation mode, the spread spectrum depth coefficient D, and the spread spectrum reference value Cr. For example, in one example, the decimal generation module 1102 may include the triangle modulation mode sub-module 1102a, the sawtooth modulation mode sub-module 1102b, the sinusoidal modulation mode sub-module 1102c, and the random modulation mode sub-module 1102d, the triangle modulation mode sub-module 1102a corresponds to the triangle modulation mode, the sawtooth modulation mode sub-module 1102b corresponds to the sawtooth modulation mode, the sinusoidal modulation mode sub-module 1102c corresponds to the sinusoidal modulation mode, and the random modulation mode sub-module 1102d corresponds to the random modulation mode. In a case where the modulation mode Am set by the user is the sinusoidal modulation mode, only the sinusoidal modulation mode sub-module 1102c can generate the third middle decimal part corresponding to the sinusoidal modulation mode according to the sinusoidal modulation mode, the spread spectrum depth coefficient D, and the spread spectrum reference value Cr, and then the third middle decimal part can be output to the synthesis sub-circuit 112 as the decimal part r(t) of the frequency control word F(t). In this case, the decimal generation module 1102 may not include the selection sub-module 1102e.

For example, for the triangle modulation mode, the sawtooth modulation mode, and the sinusoidal modulation mode, the decimal part r(t) is an approximate curve that changes regularly. Therefore, each of the triangle modulation mode sub-module 1102a, the sawtooth modulation mode sub-module 1102b, and the sinusoidal modulation mode sub-module 1102c may include an adder, a memory, a subtractor, a comparator, and the like.

In the following, the triangle modulation mode sub-module 1102a is taken as an example to describe the working principle of the modulation mode sub-module in detail. The memory in the triangle modulation mode sub-module 1102a is used to store the change step size of the decimal part r(t). For example, in the case where the spread spectrum reference value Cr is 0.5, the spread spectrum depth coefficient D is 0.5, and the spread spectrum mode of the spread spectrum output signal is central spread spectrum, the range of the decimal part r(t) is 0.25-0.75, i.e., 0.5(the spread spectrum reference value Cr)±(0.5(the spread spectrum depth coefficient D)/2), and the change step size of the triangle modulation mode can be 0.01. The first value of the decimal part r(t) can be the spread spectrum reference value Cr, i.e., 0.5, the first value (i.e., the spread spectrum reference value Cr) is increased by 0.01 using the adder in the triangle modulation mode sub-module 1102a to obtain the second value 0.51 of the decimal part r(t), the second value is increased by 0.01 using the adder to obtain the third value 0.52 of the decimal part r(t), and so on. Until the value of the decimal part r(t) is 0.75 (i.e., the maximum value of the decimal part), the maximum value (i.e., 0.75) is increased by −0.01 using the adder, that is, the maximum value is subtracted by 0.01 using the adder, so as to obtain the N-th value 0.74 of the decimal part r(t), then the N-th value is subtracted by 0.01 using the adder to obtain the (N+1)-th value 0.73 of the decimal part r(t), and so on. Until the value of the decimal part r(t) is 0.25 (i.e., the minimum value of the decimal part), the minimum value (i.e., 0.25) is increased by 0.01 again using the adder to obtain the (N+q)-th value 0.26 of the decimal part r(t), then the (N+q)-th value is increased by 0.01 using the adder to obtain the (N+q+1)-th value 0.27 of the decimal part r(t), and so on. Until the value of the decimal part r(t) is 0.5 (i.e., the spread spectrum reference value Cr), one cycle is completed. In other words, the initial value and the final value of a cycle are the same, and the value of the decimal part r(t) in the cycle reaches the maximum value once and reaches the minimum value once. The above process is continuously repeated, so that the decimal part r(t) can be generated. For example, the memory in the triangle modulation mode sub-module 1102a may also be used to store the generated decimal part r(t), the spread spectrum reference value Cr, the spread spectrum depth coefficient D, etc.

It should be noted that the rate of change of the value of the decimal part r(t) is controlled by the frequency modulation clock signal CLK_AF, that is, the frequency modulation clock signal CLK_AF can control such as the time interval between the operation of increasing the first value by 0.01 and the operation of increasing the second value by 0.01.

For example, for the random modulation mode, the decimal part r(t) is composed of a series of irregularly changing random values. The random modulation mode sub-module 1102d may be implemented by a pseudo-random binary sequence (PRBS) circuit, and the pseudo-random values generated by the PRBS circuit have a large cycle period, so that it can be approximated that the pseudo-random values changes irregularly. For example, the PRBS circuit may include a group of registers.

It should be noted that, as described above, in some embodiments, as illustrated in FIG. 3B, each modulation mode sub-module in the decimal generation module 1102 generates the middle decimal part corresponding to the corresponding modulation mode according to the corresponding modulation mode, the spread spectrum depth coefficient D, and the spread spectrum reference value Cr. In other words, the decimal generation module 1102 can generate a plurality of middle decimal parts, and then the selection sub-module 1102e selects the middle decimal part corresponding to the modulation mode Am from the plurality of middle decimal parts according to the modulation mode Am.

For example, in some embodiments, the decimal generation sub-circuit 110 may further include a spread spectrum depth control module and a reference value control module. The spread spectrum depth control module is configured to determine the spread spectrum depth coefficient D and transmit the spread spectrum depth coefficient D to the decimal generation module 1102; and the reference value control module is configured to determine the spread spectrum reference value Cr and transmit the spread spectrum reference value Cr to the decimal generation module 110. For example, the spread spectrum depth control module can directly obtain the spread spectrum depth coefficient D input by the user, and the reference value control module can directly obtain the spread spectrum reference value Cr input by the user. The spread spectrum depth control module may include a first storage circuit, the first storage circuit is used for storing the spread spectrum depth coefficient D (for example, the spread spectrum depth coefficient D is 0.5), and the first storage circuit may include various types of storage media, registers, or the like. The reference value control module may also include a second storage circuit, the second storage circuit is used for storing the spread spectrum reference value Cr (for example, the spread spectrum reference value Cr is 0.5), and the second storage circuit may include various types of storage media, registers, or the like. The spread spectrum depth coefficient D and the spread spectrum reference value Cr determine the spread spectrum range, i.e., the spread spectrum depth, of the spread spectrum output signal together.

For another example, the user can input the reference frequency and the spread spectrum depth, the spread spectrum depth control module can obtain the reference frequency and the spread spectrum depth and determine the spread spectrum depth coefficient D according to the reference frequency and the spread spectrum depth, and the reference value control module acquires the reference frequency and determine the spread spectrum reference value Cr according to the reference frequency. In this case, the spread spectrum depth control module may include a first storage circuit and a first calculation circuit, and the reference value control module may also include a second storage circuit and a second calculation circuit. The first calculation circuit in the spread spectrum depth control module is used to calculate the spread spectrum depth coefficient D according to the reference frequency and the spread spectrum depth, and the first storage circuit in the spread spectrum depth control module is used to store the spread spectrum depth coefficient D. The second calculation circuit in the reference value control module is used to calculate the spread spectrum reference value Cr according to the reference frequency, and the second storage circuit in the reference value control module is used to store the spread spectrum reference value Cr. It should be noted that both the first calculation circuit in the spread spectrum depth control module and the second calculation circuit in the reference value control module may be composed of components such as transistors, resistors, flip-flops, capacitors, operational amplifiers, etc.

For example, the spread spectrum depth coefficient D and the spread spectrum reference value Cr may be directly input to the decimal generation module 1102 by the user through an input device (e.g., a keyboard, a touch screen, a touch pad, a mouse, a knob, etc.) by a data interface. In this case, the decimal generation sub-circuit 110 may not include the spread spectrum depth control module and the reference value control module.

For example, the modulation mode Am may also be directly input to the decimal generation module 1102 by the user through the input device by the data interface.

Figure 4:
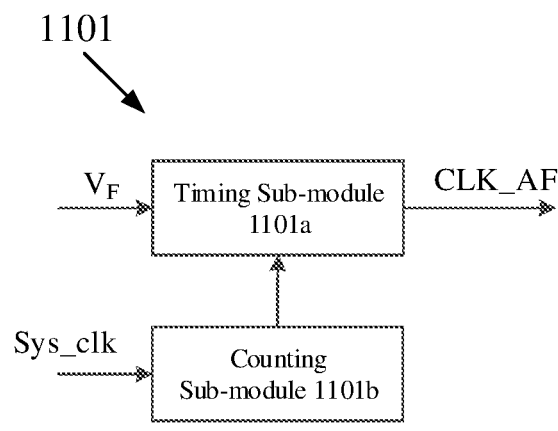
FIG. 4 is a schematic block diagram of a frequency modulation control module provided by some embodiments of the present disclosure.

FIG. 4 is a schematic block diagram of a frequency modulation control module provided by some embodiments of the present disclosure. For example, as illustrated in FIG. 4, the frequency modulation control module 1101 includes a timing sub-module 1101a and a counting sub-module 1101b. The counting sub-module 1101b is configured to count the reference clock signal Sys_clk to obtain the count value of the reference clock signal Sys_clk; and the timing sub-module 1101a is configured to determine the count period according to the modulation rate VF and determine the frequency modulation clock signal CLK_AF based on the count period and the count value.

For example, the modulation rate VF may be directly input to the timing sub-module 1101a by the user through the input device by the data interface.

For example, the count period may represent the duration of each frequency control word. For example, for the triangle modulation mode, if the frequency modulation of the frequency control word is 31.25 kHz, the modulation period corresponding to the frequency modulation is 0.000032 s (that is, 1/31250=0.000032). The modulation period represents the change period of the frequency control word. If the frequency control word needs to be changed 64 times in the modulation period, the duration of each frequency control word is 0.0000032 s/64=500 nanoseconds (ns), that is, in a case where the duration of each frequency control word is 500 ns, the requirement of the frequency modulation 31.25 kHz can be satisfied. In other words, the count period is 500 ns. For example, supposing that in a case where the count period is 500 ns, the number of pulses of the reference clock signal Sys_clk in the count period is 300, and in a case where the count value output by the counting sub-module 1101b is 1 to 150, the timing sub-module 1101a can output the binary number 0, that is, the value of the frequency modulation clock signal CLK_AF is 0; and in a case where the count value output by the counting sub-module 1101b is 150 to 300, the timing sub-module 1101a can output the binary number 1, that is, the value of the frequency modulation clock signal CLK_AF is 1. In a case where the count value reaches 300, the timing sub-module 1101a can control the counting sub-module 1101b to reset the count value to 0 to restart counting. In this way, the frequency modulation clock signal CLK_AF with a period of 500 nanoseconds can be obtained. The frequency of the frequency modulation clock signal CLK_AF is lower than the frequency of the reference clock signal Sys_clk.

For example, as illustrated in FIG. 4, the reference clock signal Sys_clk may be the clock signal of the system.

For example, the timing sub-module 1101a and the counting sub-module 1101b may be implemented by hardware circuits. The timing sub-module 1101a and the counting sub-module 1101b may be composed of components such as transistors, diodes, resistors, flip-flops, capacitors, operational amplifiers, etc. For example, the counting sub-module 1101b may include an addition counter and the like. Certainly, the functions of the counting sub-module 1101b may also be implemented by software. For example, the frequency modulation control module 1101 may further include a storage sub-module for storing computer instructions and data, and the processor may execute the computer instructions and data stored in the storage sub-module to implement the functions of the counting sub-module 1101b.

For example, as illustrated in FIG. 2, in some embodiments, the reference frequency $f_w$ may be input to the integer generation sub-circuit 111 by the user through the input device by the data interface. In this case, the integer generation sub-circuit 111 may include a calculation module and a storage module, the calculation module is used to calculate the reference frequency control word corresponding to the reference frequency $f_w$ according to the reference frequency $f_w$, the integer part of the reference frequency control word is the value of the integer part I of the frequency control word F(t), and the storage module is used to store the value of the integer part I. The storage module may be various types of storage media, registers, or the like. The calculation module may be composed of components such as transistors, resistors, flip-flops, capacitors, operational amplifiers, etc.

For another example, in other embodiments, the clock spread spectrum circuit 10 may be connected to a calculator, and the calculator can be used to calculate the value of the integer part I according to the reference frequency $f_w$, and the integer generation sub-circuit 111 may obtain the value of the integer part I directly from the calculator. In this case, the integer generation sub-circuit 111 may include only the storage module for storing the value of the integer part I.

For example, as illustrated in FIG. 2, the synthesis sub-circuit 112 is used to integrate the integer part I and the decimal part r(t) together to obtain the frequency control word F(t). The synthesis sub-circuit 112 may include a logic circuit, a register, etc.

For example, as illustrated in FIG. 2, the signal generation circuit 12 includes a base time unit generation sub-circuit 120 and a spread spectrum sub-circuit 121. The base time unit generation sub-circuit 120 is configured to generate and output a base time unit, and the spread spectrum sub-circuit 121 is configured to generate and output the spread spectrum output signal according to the frequency control word and the base time unit Δ.

For example, as illustrated in FIG. 2, the base time unit generation sub-circuit 120 is configured to output the base time unit Δ to the integer generation sub-circuit 111. The integer generation sub-circuit 111 may calculate the reference frequency control word corresponding to the reference frequency $f_w$ according to the reference frequency $f_w$ and the base time unit Δ, thereby determining the value of the integer part I of the frequency control word F(t). For example, the reference frequency control word may be expressed as:

$$F_w = 1/(f_w * \Delta) = I_w + r_w$$

where $F_w$ represents the reference frequency control word, $I_w$ represents the integer part of the reference frequency control word, and $r_w$ represents the decimal part of the reference frequency control word. The integer part I of the frequency control word F(t) is the integer part $I_w$ of the reference frequency control word. For example, in some examples, the spread spectrum reference value Cr may be the decimal part $r_w$ of the reference frequency control word.

For example, as illustrated in FIG. 2, the base time unit generation sub-circuit 120 is further configured to output the base time unit Δ to the spread spectrum sub-circuit 121.

Figure 5A:
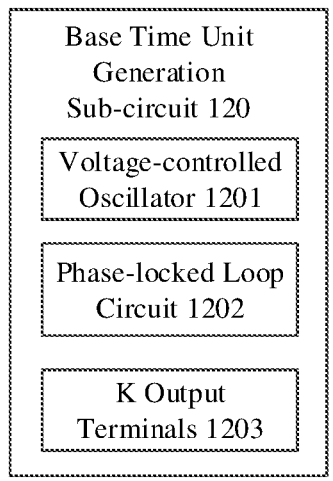
FIG. 5A illustrates a schematic block diagram of a base time unit generation sub-circuit provided by some embodiments of the present disclosure.
Figure 5B:
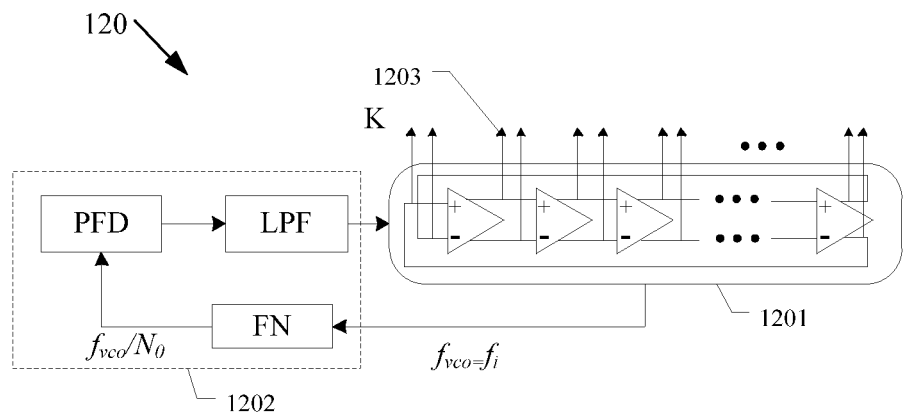
FIG. 5B illustrates a schematic structural diagram of another base time unit generation sub-circuit provided by some embodiments of the present disclosure.
Figure 6:
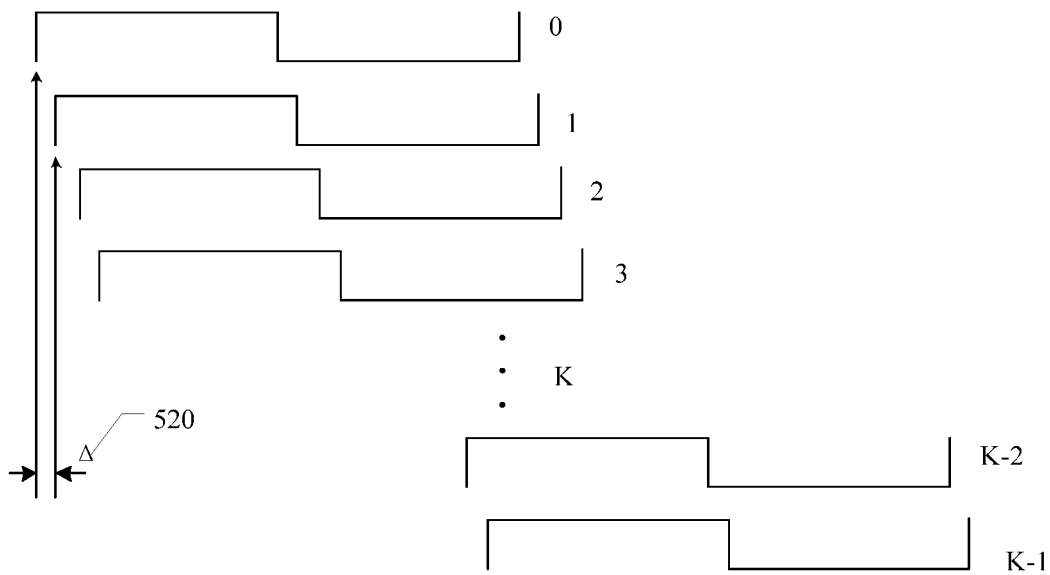
FIG. 6 illustrates a schematic diagram of K base output signals with phases evenly spaced provided by some embodiments of the present disclosure.

FIG. 5A illustrates a schematic block diagram of a base time unit generation sub-circuit provided by some embodiments of the present disclosure; FIG. 5B illustrates a schematic structural diagram of another base time unit generation sub-circuit provided by some embodiments of the present disclosure; and FIG. 6 illustrates a schematic diagram of K base output signals with phases evenly spaced provided by some embodiments of the present disclosure.

For example, the base time unit generation sub-circuit 120 is configured to generate and output K base output signals with phases evenly spaced and the base time unit Δ. The base time unit generation sub-circuit 120 may use the phase locked loop (PLL), delay locked loop (DLL), Johnson counter, or the like to generate the K base output signals with phases evenly spaced. As illustrated in FIG. 5A, in some embodiments, the base time unit generation sub-circuit 120 may include a voltage-controlled oscillator (VCO) 1201, a phase-locked loop circuit 1202, and K output terminals 1203. The voltage-controlled oscillator 1201 is configured to oscillate at a predetermined oscillation frequency. The phase-locked loop circuit 1202 is configured to lock the output frequency of the voltage-controlled oscillator 1201 to the base output frequency. The K output terminals 1203 are configured to output the K base output signals with phases evenly spaced, and K is a positive integer greater than 1. For example, K=16, 32, 128, or other values.

For example, the base time unit may be expressed as Δ, and the base output frequency may be expressed as $f_\Delta$. As illustrated in FIG. 6, the base time unit Δ is a time span between any two adjacent output signals output by the K output terminals 1203. The base time unit Δ is usually generated by a plurality of voltage-controlled oscillators 1201. The frequency $f_{vco}$ of the signal generated by the voltage-controlled oscillator 1201 may be locked to the known base output frequency $f_d$ by the phase-locked loop circuit 1202, that is, $f_d=f_{vco}$.

For example, the base time unit Δ may be calculated through the following formula:

$$\Delta = T_d/K = 1/(K \cdot f_d)$$

where $T_d$ represents the period of the signal generated by the plurality of voltage-controlled oscillators 1201, and $f_\Delta$ represents the value of the frequency of the base time unit, that is, $f_\Delta = 1/\Delta = K \cdot f_d$.

For example, as illustrated in FIG. 5B, the phase-locked loop circuit 1202 includes a phase detector PFD, a loop filter LPF, and a frequency divider FN. For example, in the embodiments of the present disclosure, firstly, for example, a reference signal having a reference frequency may be input to the phase detector PFD, the loop filter LPF, and then the voltage-controlled oscillator, and finally, the signal with the predetermined oscillation frequency $f_{vco}$ generated by the voltage-controlled oscillator can be divided through the frequency divider FN to obtain the division frequency $f_{vco}/N_0$ of the frequency division signal, where $N_0$ represents the frequency division coefficient of the frequency divider, and $N_0$ is a real number and greater than or equal to 1. The division frequency $f_{vco}/N_0$ is fed back to the phase detector PFD, and the phase detector PFD is used to compare the reference frequency of the reference signal with the division frequency $f_{vco}/N_0$. In the case where the reference frequency and the division frequency $f_{vco}/N_0$ have the equal frequency and phase, the error between the reference frequency and the division frequency $v_{vco}/N_0$ is zero. In this case, the phase-locked loop circuit 1202 is in a locked state.

For example, the loop filter LPF may be a low-pass filter.

It should be noted that the circuit structure illustrated in FIG. 5B is only an exemplary implementation of the base time unit generation sub-circuit 120. The specific structure of the base time unit generation sub-circuit 120 is not limited to this, and the base time unit generation sub-circuit 120 may also be constructed by other circuit structures, and the present disclosure is not limited thereto. For example, K and Δ can be set in advance according to actual needs and are fixed.

Figure 7:
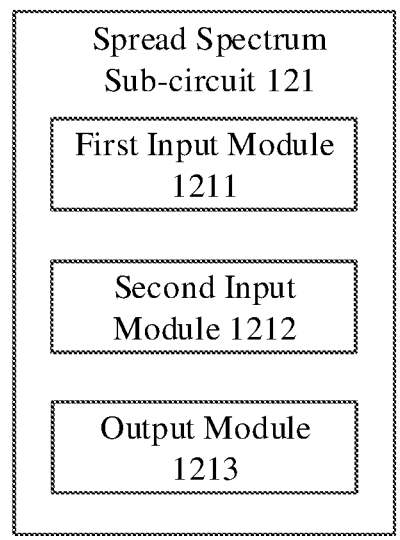
FIG. 7 illustrates a schematic block diagram of a spread spectrum sub-circuit provided by some embodiments of the present disclosure.
Figure 8:
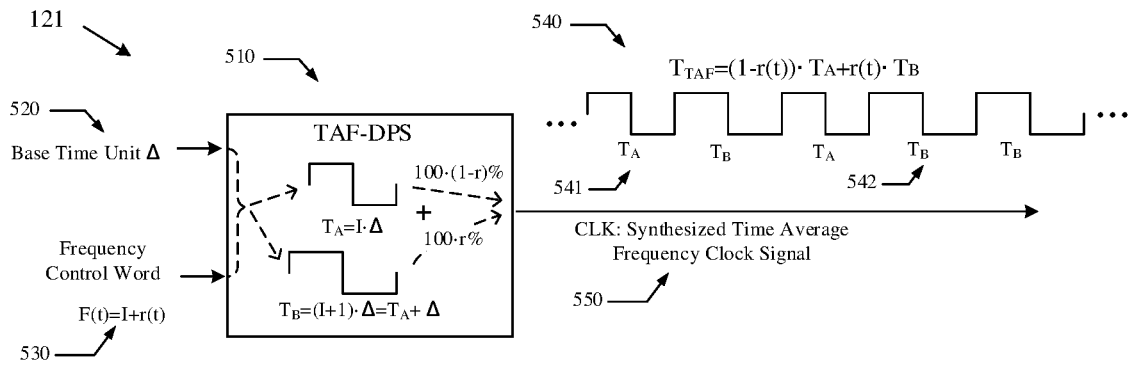
FIG. 8 illustrates a schematic diagram of a working principle of a spread spectrum sub-circuit provided by some embodiments of the present disclosure.

FIG. 7 illustrates a schematic block diagram of a spread spectrum sub-circuit provided by some embodiments of the present disclosure, and FIG. 8 illustrates a schematic diagram of a working principle of a spread spectrum sub-circuit provided by some embodiments of the present disclosure.

For example, as illustrated in FIG. 7, the spread spectrum sub-circuit 121 includes a first input module 1211, a second input module 1212, and an output module 1213. The first input module 1211 is configured to receive the K base output signals with phase evenly spaced and the base time unit from the base time unit generation sub-circuit 120. The second input module 1212 is configured to receive the frequency control word F(t) from the control circuit 11. The output module 1213 is configured to generate a first period and a second period, generate a spread spectrum output signal according to the first period and the second period, and output the spread spectrum output signal. The occurrence probability of the first period and the second period is controlled by the value of the decimal part r(t) of the frequency control word F(t).

For example, the spread spectrum sub-circuit 121 may include a time average frequency direct period synthesizer (TAF-DPS). The TAF-DPS technology is an emerging frequency synthesis technology, and may generate pulse signals of any frequency based on the new time average frequency concept. In other words, the TAF-DPS can achieve fine frequency adjustment with small frequency granularity. In addition, because each single pulse is directly constructed, the output frequency of the TAF-DPS can be changed instantaneously, that is, can have the rapidity of frequency switching. Experiments show that the frequency granularity of the TAF-DPS can reach several ppb (parts per billion). More importantly, the frequency switching speed of the TAF-DPS is quantifiable. That is, the response time from the moment when the frequency control word is updated to the moment when the frequency is switched can be calculated based on the clock period. The TAF-DPS can be used as a specific implementation of the spread spectrum sub-circuit 121 in the embodiments of the present disclosure.

For example, the TAF-DPS may be implemented by an application specific integrated circuit (for example, ASIC) or a programmable logic device (for example, FPGA). Alternatively, the TAF-DPS may be implemented by conventional analog circuit devices. The present disclosure is not limited in this aspect.

In the following, the working principle of the spread spectrum sub-circuit 121 based on the TAF-DPS is described with reference to FIG. 8.

For example, as illustrated in FIG. 8, the spread spectrum sub-circuit 121 based on the TAF-DPS 510 has two inputs: a base time unit 520 and a frequency control word 530. The frequency control word 530 is expressed as F(t), F(t)=I+r(t), I is an integer greater than 1, and r(t) is a fraction and changes discretely with time.

For example, the TAF-DPS 510 has an output CLK 550. The output CLK 550 is a synthesized time average frequency clock signal. In the embodiments of the present disclosure, the output CLK 550 is the spread spectrum output signal. According to the base time unit 520, the TAF-DPS 510 can generate two types of periods, that is, a first period $T_A = I \cdot \Delta$, and a second period $T_B = (I+1) \cdot \Delta$. The spread spectrum output signal CLK 550 is a clock pulse string 540, and the clock pulse string 540 is composed of the first period $T_A$ 541 and the second period $T_B$ 542 in an interleaved manner. The fraction r(t) is used to control the occurrence probability of the second period $T_B$, and therefore, r(t) can also determine the occurrence probability of the first period $T_A$.

For example, as illustrated in FIG. 8, the period $T_{TAF}$ of the spread spectrum output signal CLK 550 may be expressed by the following formula:

$$T_{TAF} = (1-r(t)) \cdot T_A + r(t) \cdot T_B$$

$$= T_A + r(t) \cdot (T_B - T_A) = T_A + r(t) \cdot \Delta = I \cdot \Delta + r(t) \cdot \Delta = (I + r(t)) \cdot \Delta$$

Therefore, in the case where the frequency control word 530 is F(t)=I+r(t), it can be obtained that:

$$T_{TAF} = F(t) \cdot \Delta \quad (1)$$

For example, based on the above formula (1), the frequency $f_{css}$ of the spread spectrum output signal CLK 550 can be expressed as:

$$f_{css}=1/T_{TAF}=1/(F(t)\cdot \Delta) \quad (2)$$

From the above formula (1) and formula (2), it can be seen that the period $T_{TAF}$ of the spread spectrum output signal CLK 550 output by the TAF-DPS 510 is linearly proportional to the frequency control word 530, and the frequency $f_{css}$ of the spread spectrum output signal CLK 550 is inversely proportional to the frequency control word 530 and has a small linear shape. In a case where the frequency control word 530 changes, the period $T_{TAF}$ of the spread spectrum output signal CLK 550 output by the TAF-DPS 510 also changes in the same form, and the frequency of the spread spectrum output signal CLK 550 also changes accordingly.

Figure 9:
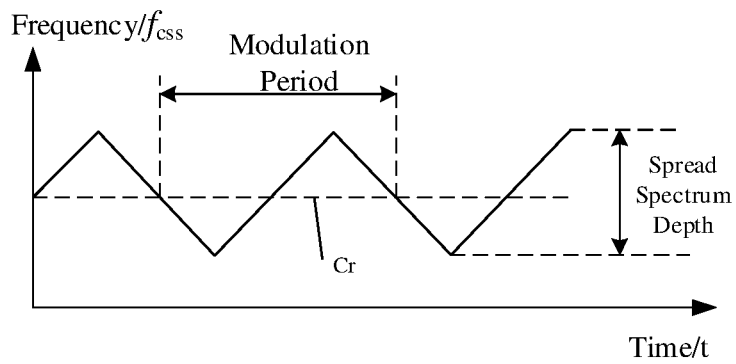
FIG. 9 is a schematic diagram of frequency modulation determined according to a triangle modulation mode provided by some embodiments of the present disclosure.

FIG. 9 is a schematic diagram of frequency modulation determined according to a triangle modulation mode provided by some embodiments of the present disclosure. For example, in a case where the time interval of the decimal part r(t) changing with time is short, the decimal part r(t) is approximately a triangular wave curve, and therefore, the frequency control word F(t) is also approximately a triangular wave curve. As illustrated in the formula (2), the frequency $f_{css}$ of the spread spectrum output signal generated based on the TAF-DPS and the frequency control word 530 are in the corresponding reciprocal form, and the frequency fess has the property of a small amount of linearity, so that as illustrated in FIG. 9, the frequency $f_{css}$ of the spread spectrum output signal is also approximately a triangular wave curve changing with time.

Therefore, in the clock spread spectrum circuit provided by the embodiments of the present disclosure, the frequency of the spread spectrum output signal can be controlled only by controlling the frequency control word F(t). In a case where the frequency control word F(t) is controlled to have waveforms in different modulation modes, the spread spectrum effect of the corresponding modulation mode can be achieved, that is, in the frequency domain, it is expressed as sweeping the frequency within a certain frequency range. If the greater the frequency difference between the maximum value and the minimum value of the frequency control word, the wider the range of spread spectrum, that is, the better the effect of reducing electromagnetic interference. In this way, in a case where the circuit system turns on the spread spectrum function, the basic function of the circuit system is not affected, so that in a case where the circuit system is in normal operation, the spread spectrum function can be turned on all the time, which not only ensures the safety of the circuit system, but also reduces the electromagnetic interference of the circuit system.

In addition, in a case where F(t) changes between two integers, the period of the spread spectrum output signal CLK 550 has only two types, a long period TB and a short period TA. Therefore, when designing a digital circuit, it is only necessary to use the short period to constrain the setup time, and the hold time has nothing to do with the period and is only related to the edge. For the circuit system including the clock spread spectrum circuit, in a case where the spread spectrum function of the circuit system is turned on and turned off, the period of the signal output by the TAF-DPS 510 only comprises two period types, which does not affect the normal function of the circuit system, thereby not only ensuring the normal operation of the circuit system, but also reducing the electromagnetic interference.

For example, according to the formula (2), the frequency of the spread spectrum output signal is inversely proportional to the frequency control word, so that the maximum value of the frequency of the spread spectrum output signal is 1/(Fmin*Δ), the minimum value of the frequency of the spread spectrum output signal is 1/(Fmax*Δ), and the spread spectrum depth of the frequency of the spread spectrum output signal is expressed as: FD=1/(Fmin*Δ)−1/(Fmax*Δ), where FD represents the spread spectrum depth.

Figure 10A:
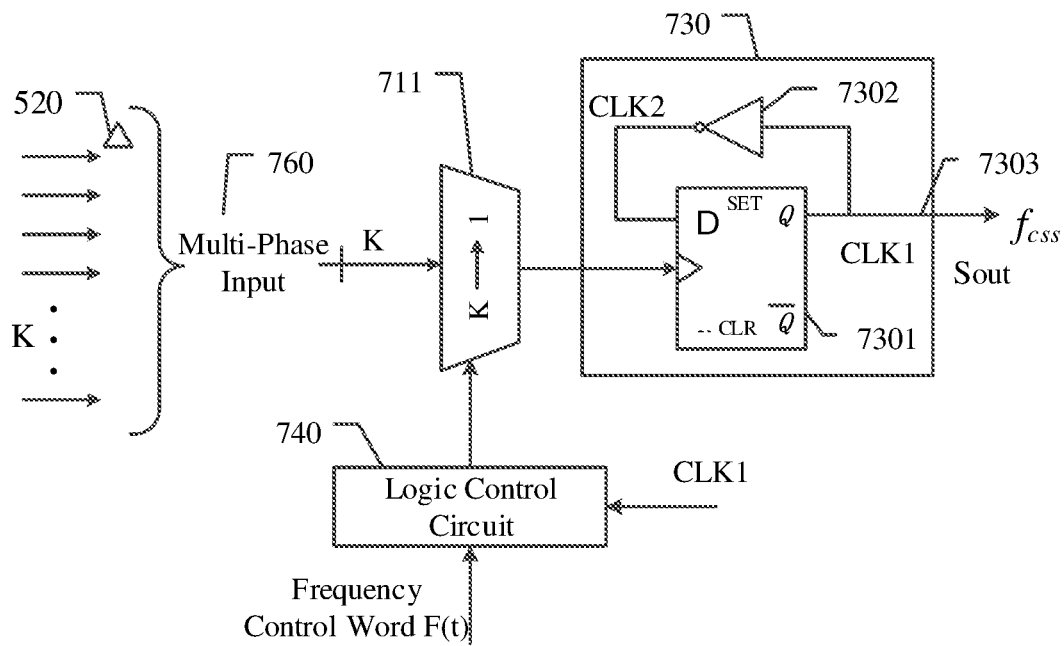
FIG. 10A is a schematic structural diagram of a spread spectrum sub-circuit provided by some embodiments of the present disclosure.
Figure 10B:
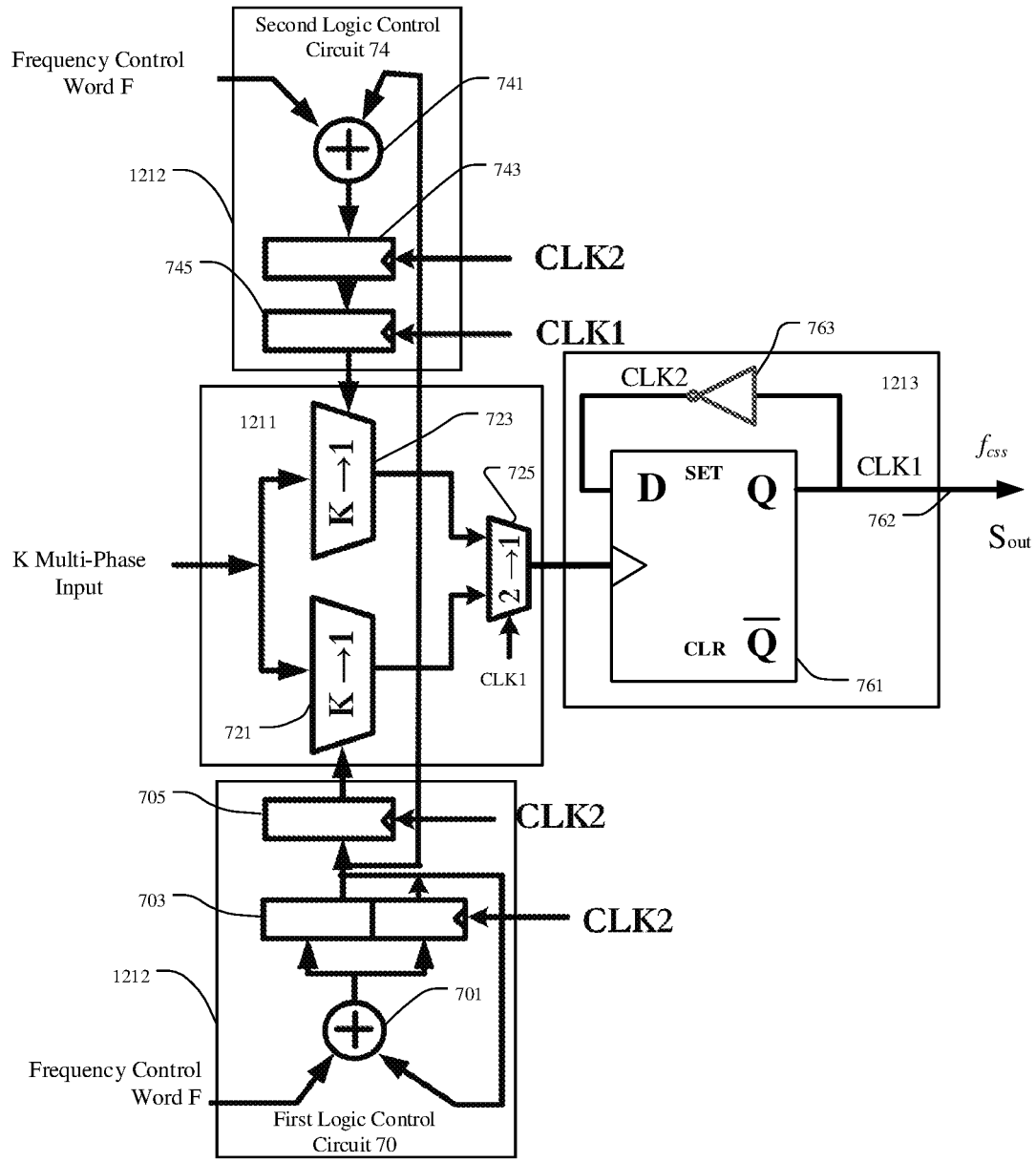
FIG. 10B is a schematic structural diagram of another spread spectrum sub-circuit provided by some embodiments of the present disclosure.

FIG. 10A is a schematic structural diagram of a spread spectrum sub-circuit provided by some embodiments of the present disclosure, and FIG. 10B is a schematic structural diagram of another spread spectrum sub-circuit provided by some embodiments of the present disclosure.

In the following, the circuit structure of the TAF-DPS is described with reference to FIG. 10A and FIG. 10B.

For example, as illustrated in FIG. 10A, in an embodiment, the first input module 1211 includes a K→1 multiplexer 711. The K→1 multiplexer 711 has a plurality of input terminals for receiving K base output signals with phase evenly spaced, a control input terminal, and an output terminal.

For example, the output module 1213 includes a trigger circuit 730. The trigger circuit 730 is used to generate a pulse string. The pulse string is composed of a pulse signal of the first period $T_A$ and a pulse signal of the second period $T_B$ in an interleaved manner. The trigger circuit 730 includes a D flip-flop 7301, an inverter 7302, and an output terminal 7303. The D flip-flop 7301 includes a data input terminal, a clock input terminal for receiving the output from the output terminal of the K→1 multiplexer 711, and an output terminal for outputting the first clock signal CLK1. The inverter 7302 includes an inverter input terminal for receiving the first clock signal CLK1 and an inverter output terminal for outputting the second clock signal CLK2, and the inverter output terminal is connected to the data input terminal of the D flip-flop 7301 to output the second clock signal CLK2 to the data input terminal of the D flip-flop 7301. The output terminal 7303 of the trigger circuit 730 is used to output the first clock signal CLK1 as the spread spectrum output signal $S_{out}$.

For example, the first clock signal CLK1 includes a pulse string.

For example, the second input module 1212 includes a logic control circuit 740. The logic control circuit 740 includes an input terminal for receiving the frequency control word F(t) output by the control circuit 11, a clock input terminal for receiving the first clock signal CLK1, and an output terminal connected to the control input terminal of the K→1 multiplexer of the first input module 1211.

For example, as illustrated in FIG. 10B, in another embodiment, the first input module 1211 includes a first K→1 multiplexer 721, a second K→1 multiplexer 723, and a 2→1 multiplexer 725. Each of the first K→1 multiplexer 721 and the second K→1 multiplexer 723 includes a plurality of input terminals for receiving K base output signals with phases evenly spaced, a control input terminal, and an output terminal. The 2→1 multiplexer 725 includes a control input terminal, an output terminal, a first input terminal for receiving the output of the first K→1 multiplexer 721, and a second input terminal for receiving the output of the second K→1 multiplexer 723.

For example, as illustrated in FIG. 10B, the output module 1213 includes a trigger circuit. The trigger circuit is used to generate a pulse string. The trigger circuit includes a D flip-flop 761, an inverter 763, and an output terminal 762. The D flip-flop 761 includes a data input terminal, a clock input terminal for receiving the output from the output terminal of the 2→1 multiplexer 725, and an output terminal for outputting the first clock signal CLK1. The inverter 763 includes an input terminal for receiving the first clock signal CLK1 and an output terminal for outputting the second clock signal CLK2. The output terminal of the inverter 763 is connected to the data input terminal of the D flip-flop 761 to output the second clock signal CLK2 to the data input terminal of the D flip-flop 761. The output terminal 762 of the trigger circuit is used to output the first clock signal CLK1 as the spread spectrum output signal $S_{out}$.

For example, the first clock signal CLK1 is connected to the control input terminal of the 2→1 multiplexer 725.

For example, as illustrated in FIG. 10B, the second input module 1212 includes a first logic control circuit 70 and a second logic control circuit 74. The first logic control circuit 70 includes a first adder 701, a first register 703, and a second register 705. The second logic control circuit 74 includes a second adder 741, a third register 743, and a fourth register 745.

The first adder 701 adds the frequency control word (F(t)) and the most significant bits (for example, 5 bits) stored in the first register 703, and then at the rising edge of the second clock signal CLK2, the addition result is stored in the first register 703. Alternatively, the first adder 701 adds the frequency control word (F(t)) and all the information stored in the first register 703, and then at the rising edge of the second clock signal CLK2, the addition result is stored in the first register 703. At the next rising edge of the second clock signal CLK2, the most significant bits stored in the first register 703 may be stored in the second register 705 and used as the selection signal of the first K→1 multiplexer 721 for selecting one signal from the K multi-phase input signals as the first output signal of the first K→1 multiplexer 721.

The second adder 741 adds the frequency control word (F(t)) and the most significant bits stored in the first register 703, and then at the rising edge of the second clock signal CLK2, the addition result is stored in the third register 743. At the next rising edge of the first clock signal CLK1, the information stored in the third register 743 may be stored in the fourth register 745 and used as the selection signal of the second K→1 multiplexer 723 for selecting one signal from the K multiphase input signals as the second output signal of the second K→1 multiplexer 723.

At the rising edge of the first clock signal CLK1, the 2→1 multiplexer 725 selects one of the first output signal from the first K→1 multiplexer 721 and the second output signal from the second K→1 multiplexer 723 as the output signal, which serves as the input clock signal of the D flip-flop 761, of the 2→1 multiplexer 725.

For example, the period ($T_{TAF}$) of the spread spectrum output signal $S_{out}$ output by the TAF-DPS illustrated in FIG. 10A and FIG. 10B can be calculated through the above formula (1). For example, the frequency control word is set in the form of F(t)=I+r(t), where I is an integer and r(t) is a decimal within the range of [0,1).

Figure 11:
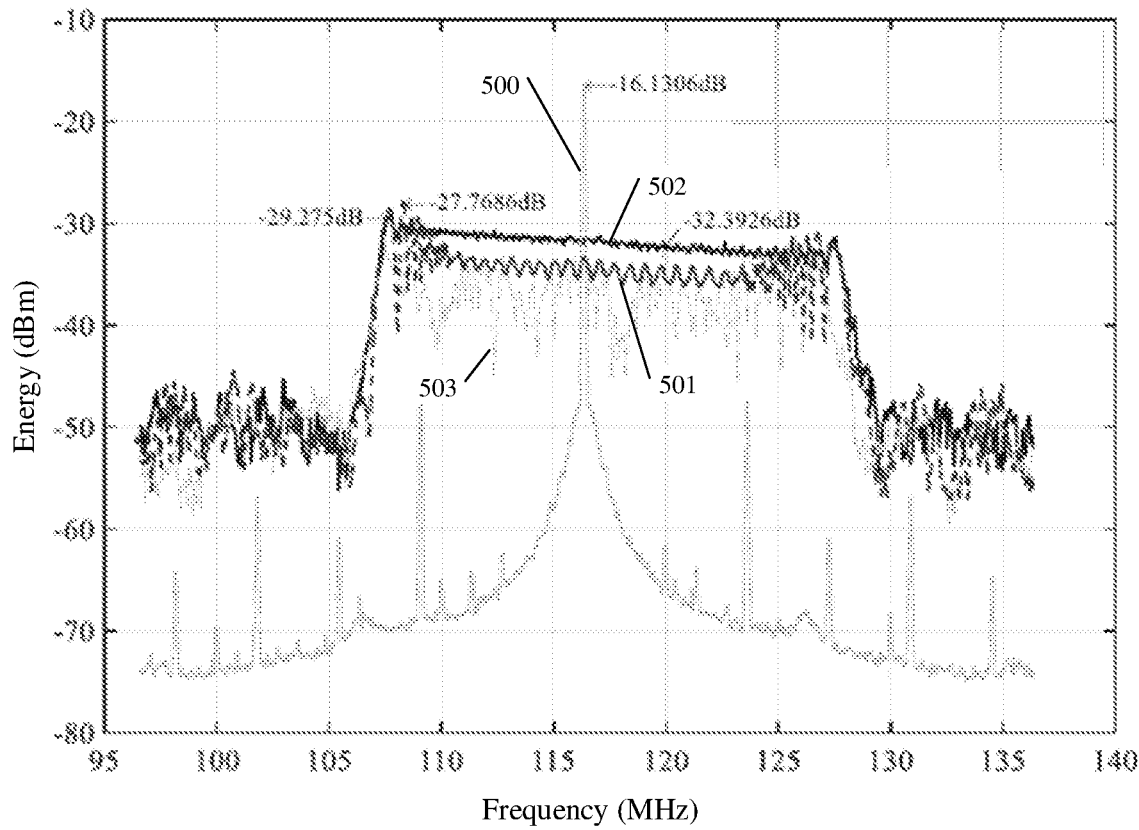
FIG. 11 is a schematic diagram of spectrum comparison results before and after spread spectrum provided by some embodiments of the present disclosure.

FIG. 11 is a schematic diagram of spectrum comparison results before and after spread spectrum provided by some embodiments of the present disclosure. As illustrated in FIG. 11, the reference frequency is represented by a curve 500, the first spread spectrum frequency after spread spectrum according to the triangle modulation mode is represented by a curve 501, the second spread spectrum frequency after spread spectrum according to the sawtooth modulation mode is represented by a curve 502, and the third spread spectrum frequency after spread spectrum according to the random modulation mode is represented by a curve 503. The modulation rate corresponding to the first spread spectrum frequency, the modulation rate corresponding to the second spread spectrum frequency, and the modulation rate corresponding to the third spread spectrum frequency are all 30 kHz, and the resolution bandwidths of the test equipment spectrum analyzer corresponding to the first spread spectrum frequency, the second spread spectrum frequency, and the third spread spectrum frequency are all 120 kHz. The first spread spectrum frequency, the second spread spectrum frequency, and the third spread spectrum frequency are all frequencies of the spread spectrum output signals generated by the same clock spread spectrum circuit provided by the embodiments of the present disclosure based on different modulation modes. As illustrated in FIG. 11, for the reference frequency without spread spectrum, the energy of the peak of the reference frequency is −16.1306 dB, the energy of the first spread spectrum frequency is −29.275 dB, the energy of the second spread spectrum frequency is −32.3926 dB, and the energy of the third spread spectrum frequency is −27.7686 dB. It can be seen from the experimental results that the spread spectrum frequency based on any modulation mode can effectively reduce EMI peak noise.

Figure 12:
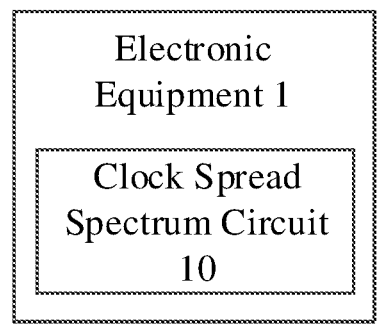
FIG. 12 is a schematic block diagram of an electronic equipment provided by some embodiments of the present disclosure.
Figure 13:
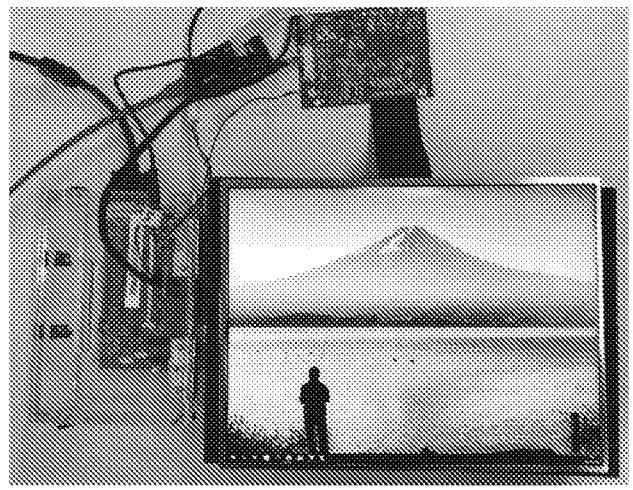
FIG. 13 is a screenshot of an electronic equipment under normal operation provided by some embodiments of the present disclosure.

At least one embodiment of the present disclosure further provides an electronic equipment. FIG. 12 is a schematic block diagram of an electronic equipment provided by some embodiments of the present disclosure, and FIG. 13 is a screenshot of an electronic equipment under normal operation provided by some embodiments of the present disclosure.

For example, as illustrated in FIG. 12, the electronic equipment 1 provided by the embodiments of the present disclosure may include the clock spread spectrum circuit 10 according to any one of the above embodiments.

For example, the electronic equipment 1 may be a liquid crystal display device or the like, and the clock spread spectrum circuit 10 may be applied to a TCON of the liquid crystal display device. As illustrated in FIG. 13, in a case where the liquid crystal display device displays, the spread spectrum function of the liquid crystal display device is turned on, and the display effect of the liquid crystal display device is not be affected.

It should be noted that, detailed descriptions of the clock spread spectrum circuit 10 may be with reference to the related descriptions of the clock spread spectrum circuit in the above embodiments, and details are not described herein again.

Figure 14:
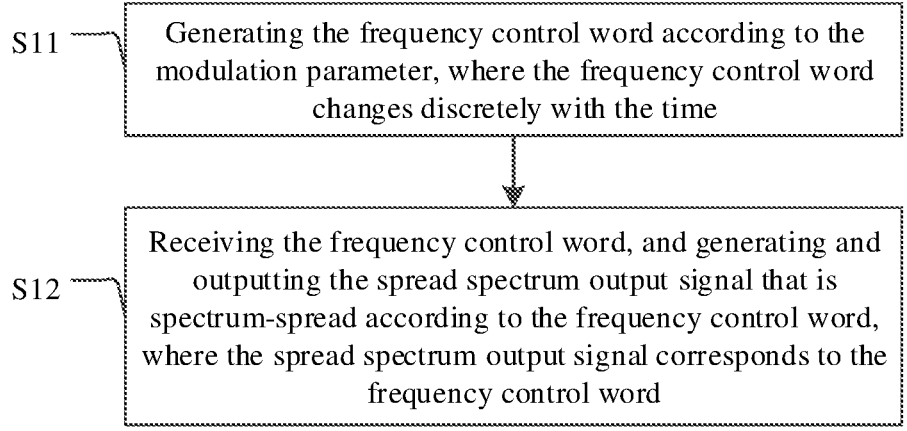
FIG. 14 is a schematic flowchart of a clock spread spectrum method provided by some embodiments of the present disclosure.

At least one embodiment of the present disclosure further provides a clock spread spectrum method. FIG. 14 is a schematic flowchart of a clock spread spectrum method provided by some embodiments of the present disclosure. The clock spread spectrum method provided by the embodiments of the present disclosure may be implemented based on the clock spread spectrum circuit according to any one of the embodiments of the present disclosure.

For example, as illustrated in FIG. 14, the clock spread spectrum method provided by the embodiments of the present disclosure may include the following steps.

S11: generating the frequency control word according to the modulation parameter, where the frequency control word changes discretely with the time.

S12: receiving the frequency control word, and generating and outputting the spread spectrum output signal that is spectrum-spread according to the frequency control word, where the spread spectrum output signal corresponds to the frequency control word.

The clock spread spectrum method provided by the embodiments of the present disclosure may implement to turn on the spread spectrum functions of various modulation modes (such as the triangle wave modulation mode, and the sawtooth wave modulation mode), and can not introduce additional noise when the spread spectrum function is turned on, that is, can effectively reduce electromagnetic interference without affecting the normal operation of the circuit system.

For example, the frequency control word may include a decimal part and an integer part, the integer part is an integer, the decimal part changes discretely with time, the decimal part is a decimal, and the range of the decimal part is [0,1).

For example, the modulation parameter includes a spread spectrum depth coefficient, a spread spectrum reference value, a modulation mode, a modulation rate, and a reference frequency, which correspond to the spread spectrum output signal. Step S11 may include: generating the decimal part according to the spread spectrum depth coefficient, the spread spectrum reference value, the modulation mode, and the modulation rate; generating the integer part according to the reference frequency; and generating the frequency control word according to the decimal part and the integer part.

For example, in step S12, the spread spectrum output signal may be generated by the TAF-DPS.

It should be noted that, for the description of the clock spread spectrum method, reference may be made to the above description of the clock spread spectrum circuit. The clock spread spectrum method illustrated in FIG. 14 may be implemented by the clock spread spectrum circuit according to any one of the embodiments of the present disclosure. For example, step S11 may be implemented by the control circuit in the clock spread spectrum circuit according to any one of the embodiments of the present disclosure, step S12 may be implemented by the signal generation circuit in the clock spread spectrum circuit according to any one of the embodiments of the present disclosure, and similar operations or steps are not described herein again.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a structure may be enlarged. It should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A clock spread spectrum circuit, comprising:
a control circuit, configured to generate a frequency control word according to a modulation parameter, wherein the frequency control word changes discretely with time; and
a signal generation circuit, configured to receive the frequency control word and generate and output a spread spectrum output signal that is spectrum-spread according to the frequency control word, wherein the spread spectrum output signal corresponds to the frequency control word;
wherein the signal generation circuit comprises:
a base time unit generation sub-circuit, configured to generate and output a base time unit; and
a spread spectrum sub-circuit, configured to generate and output the spread spectrum output signal according to the frequency control word and the base time unit;
the spread spectrum sub-circuit is a time average frequency direct period synthesizer;
wherein the frequency control word is expressed as:

$F(t)=I+r(t),$ wherein F(t) is the frequency control word, I is an integer part of the frequency control word, I is a constant and an integer, r(t) is a decimal part of the frequency control word, r(t) is a decimal and discretely changes with the time, and t represents the time;
wherein the modulation parameter comprises a spread spectrum depth coefficient, a spread spectrum reference value, a modulation rate, and a modulation mode, which correspond to the spread spectrum output signal,
the control circuit comprises: a decimal generation sub-circuit, configured to generate the decimal part according to the spread spectrum depth coefficient, the spread spectrum reference value, the modulation mode, and the modulation rate;
wherein the decimal generation sub-circuit comprises:
a frequency modulation control module, configured to generate a frequency modulation clock signal according to the modulation rate to control a rate of change of the frequency control word; and
a decimal generation module, configured to generate and output the decimal part to a synthesis sub-circuit according to the modulation mode, the spread spectrum depth coefficient, and the spread spectrum reference value under control of the frequency modulation clock signal;
wherein the decimal generation module comprises a selection sub-module and a plurality of modulation mode sub-modules corresponding to a plurality of modulation modes,
the plurality of modulation modes comprise at least two modulation modes selected from a group consisting of a triangle modulation mode, a sawtooth modulation mode, a sinusoidal modulation mode, and a random modulation mode,
each modulation mode sub-module of the plurality of modulation mode sub-modules is configured to generate a middle decimal part corresponding to a modulation mode corresponding to the modulation mode sub-module according to the modulation mode corresponding to the modulation mode sub-module, the spread spectrum depth coefficient, and the spread spectrum reference value;
the selection sub-module is configured to select one of a plurality of middle decimal parts generated by the plurality of modulation mode sub-modules as the decimal part according to the modulation mode.

2. The clock spread spectrum circuit according to claim 1, wherein the modulation parameter further comprises a reference frequency corresponding to the spread spectrum output signal, and the control circuit further comprises:
an integer generation sub-circuit, configured to generate the integer part according to the reference frequency; and
the synthesis sub-circuit, configured to receive the decimal part and the integer part and generate the frequency control word based on the decimal part and the integer part.

3. The clock spread spectrum circuit according to claim 1, wherein the frequency modulation control module comprises:
a counting sub-module, configured to count a reference clock signal to obtain a count value of the reference clock signal; and
a timing sub-module, configured to determine a count period according to the modulation rate and determine the frequency modulation clock signal based on the count period and the count value.

4. The clock spread spectrum circuit according to claim 1, wherein the base time unit generation sub-circuit comprises:
a voltage-controlled oscillator, configured to oscillate at a predetermined oscillation frequency;
a phase-locked loop circuit, configured to lock an output frequency of the voltage-controlled oscillator to a base output frequency; and
K output terminals, configured to output K base output signals with phases evenly spaced, wherein K is a positive integer greater than 1,
wherein the base output frequency is expressed as $f_d$, the base time unit is a time span between any two adjacent base output signals output by the K output terminals, the base time unit is expressed as $\Delta$, and $\Delta = 1/(K \cdot f_d)$.

5. The clock spread spectrum circuit according to claim 1, wherein a maximum value of the frequency control word and a minimum value of the frequency control word satisfy a formula: $0 \leq Fmax - Fmin < 1$,
wherein Fmin represents the minimum value of the frequency control word, and Fmax represents the maximum value of the frequency control word.

6. An electronic equipment, comprising a clock spread spectrum circuit,
wherein the clock spread spectrum circuit comprises:
a control circuit, configured to generate a frequency control word according to a modulation parameter, wherein the frequency control word changes discretely with time; and
a signal generation circuit, configured to receive the frequency control word and generate and output a spread spectrum output signal that is spectrum-spread according to the frequency control word, wherein the spread spectrum output signal corresponds to the frequency control word;
wherein the signal generation circuit comprises:
a base time unit generation sub-circuit, configured to generate and output a base time unit; and
a spread spectrum sub-circuit, configured to generate and output the spread spectrum output signal according to the frequency control word and the base time unit;
the spread spectrum sub-circuit is a time average frequency direct period synthesizer;
wherein the frequency control word is expressed as:

$F(t)=I+r(t)$, wherein F(t) is the frequency control word, I is an integer part of the frequency control word, I is a constant and an integer, r(t) is a decimal part of the frequency control word, r(t) is a decimal and discretely changes with the time, and t represents the time;
wherein the modulation parameter comprises a spread spectrum depth coefficient, a spread spectrum reference value, a modulation rate, and a modulation mode, which correspond to the spread spectrum output signal,
the control circuit comprises: a decimal generation sub-circuit, configured to generate the decimal part according to the spread spectrum depth coefficient, the spread spectrum reference value, the modulation mode, and the modulation rate;
wherein the decimal generation sub-circuit comprises:
a frequency modulation control module, configured to generate a frequency modulation clock signal according to the modulation rate to control a rate of change of the frequency control word; and
a decimal generation module, configured to generate and output the decimal part to a synthesis sub-circuit according to the modulation mode, the spread spectrum depth coefficient, and the spread spectrum reference value under control of the frequency modulation clock signal;
wherein the decimal generation module comprises a selection sub-module and a plurality of modulation mode sub-modules corresponding to a plurality of modulation modes,
the plurality of modulation modes comprise at least two modulation modes selected from a group consisting of a triangle modulation mode, a sawtooth modulation mode, a sinusoidal modulation mode, and a random modulation mode,
each modulation mode sub-module of the plurality of modulation mode sub-modules is configured to generate a middle decimal part corresponding to a modulation mode corresponding to the modulation mode sub-module according to the modulation mode corresponding to the modulation mode sub-module, the spread spectrum depth coefficient, and the spread spectrum reference value;
the selection sub-module is configured to select one of a plurality of middle decimal parts generated by the plurality of modulation mode sub-modules as the decimal part according to the modulation mode.

7. A clock spread spectrum method, applied to a clock spread spectrum circuit,
wherein the clock spread spectrum circuit comprises:
a control circuit, configured to generate a frequency control word according to a modulation parameter, wherein the frequency control word changes discretely with time; and
a signal generation circuit, configured to receive the frequency control word and generate and output a spread spectrum output signal that is spectrum-spread according to the frequency control word, wherein the spread spectrum output signal corresponds to the frequency control word,
wherein the signal generation circuit comprises:
a base time unit generation sub-circuit, configured to generate and output a base time unit; and
a spread spectrum sub-circuit, configured to generate and output the spread spectrum output signal according to the frequency control word and the base time unit;
the spread spectrum sub-circuit is a time average frequency direct period synthesizer;
wherein the frequency control word is expressed as:

$F(t)=I+r(t)$, wherein F(t) is the frequency control word, I is an integer part of the frequency control word, I is a constant and an integer, r(t) is a decimal part of the frequency control word, r(t) is a decimal and discretely changes with the time, and t represents the time;

wherein the modulation parameter comprises a spread spectrum depth coefficient, a spread spectrum reference value, a modulation rate, and a modulation mode, which correspond to the spread spectrum output signal, the control circuit comprises: a decimal generation sub-circuit, configured to generate the decimal part according to the spread spectrum depth coefficient, the spread spectrum reference value, the modulation mode, and the modulation rate;

wherein the decimal generation sub-circuit comprises:

a frequency modulation control module, configured to generate a frequency modulation clock signal according to the modulation rate to control a rate of change of the frequency control word; and a decimal generation module, configured to generate and output the decimal part to a synthesis sub-circuit according to the modulation mode, the spread spectrum depth coefficient, and the spread spectrum reference value under control of the frequency modulation clock signal;

wherein the decimal generation module comprises a selection sub-module and a plurality of modulation mode sub-modules corresponding to a plurality of modulation modes, the plurality of modulation modes comprise at least two modulation modes selected from a group consisting of a triangle modulation mode, a sawtooth modulation mode, a sinusoidal modulation mode, and a random modulation mode, each modulation mode sub-module of the plurality of modulation mode sub-modules is configured to generate a middle decimal part corresponding to a modulation mode corresponding to the modulation mode sub-module according to the modulation mode corresponding to the modulation mode sub-module, the spread spectrum depth coefficient, and the spread spectrum reference value;

the selection sub-module is configured to select one of a plurality of middle decimal parts generated by the plurality of modulation mode sub-modules as the decimal part according to the modulation mode;

wherein the clock spread spectrum method comprises:

generating the frequency control word according to the modulation parameter; and receiving the frequency control word, and generating and outputting the spread spectrum output signal that is spectrum-spread according to the frequency control word.

8. The clock spread spectrum method according to claim 7, wherein the modulation parameter further comprises a reference frequency corresponding to the spread spectrum output signal, and generating the frequency control word according to the modulation parameter comprises:

generating the decimal part according to the spread spectrum depth coefficient, the spread spectrum reference value, the modulation mode, and the modulation rate;

generating the integer part according to the reference frequency; and generating the frequency control word according to the decimal part and the integer part.

9. The clock spread spectrum method according to claim 8, wherein generating the decimal part according to the spread spectrum depth coefficient, the spread spectrum reference value, the modulation mode, and the modulation rate, comprises:

generating the frequency modulation clock signal according to the modulation rate to control the rate of change of the frequency control word; and generating the decimal part according to the modulation mode, the spread spectrum depth coefficient, and the spread spectrum reference value under control of the frequency modulation clock signal.

10. The clock spread spectrum method according to claim 7, wherein receiving the frequency control word, and generating and outputting the spread spectrum output signal that is spectrum-spread according to the frequency control word, comprises:

generating and outputting the base time unit; and generating and outputting the spread spectrum output signal according to the frequency control word and the base time unit.

* * * * *